United States Patent
Dominguez et al.

(10) Patent No.: US 7,858,525 B2
(45) Date of Patent: Dec. 28, 2010

(54) FLUORINE-FREE PRECURSORS AND METHODS FOR THE DEPOSITION OF CONFORMAL CONDUCTIVE FILMS FOR NANOINTERCONNECT SEED AND FILL

(75) Inventors: Juan E. Dominguez, Hillsboro, OR (US); Adrien R. Lavoie, Beaverton, OR (US); John J. Plombon, Portland, OR (US); Joseph H. Han, San Jose, CA (US); Harsono S. Simka, Saratoga, CA (US); Bryan C. Hendrix, Danbury, CT (US); Gregory T. Stauf, New Milford, CT (US)

(73) Assignee: Intel Corporation, Santa Clara, CA (US)

( * ) Notice: Subject to any disclaimer, the term of this patent is extended or adjusted under 35 U.S.C. 154(b) by 377 days.

(21) Appl. No.: 11/694,677

(22) Filed: Mar. 30, 2007

(65) Prior Publication Data

US 2008/0237861 A1 Oct. 2, 2008

(51) Int. Cl.
H01L 21/44 (2006.01)

(52) U.S. Cl. .................. 438/687; 438/784; 438/758; 438/771; 438/783; 438/628; 438/618; 438/760; 438/643; 438/685; 438/686; 438/694; 438/696; 438/707; 438/763

(58) Field of Classification Search .......... 438/687; 428/831; 257/E21.579
See application file for complete search history.

(56) References Cited

U.S. PATENT DOCUMENTS

| | | | |
|---|---|---|---|
| 5,391,517 A * | 2/1995 | Gelatos et al. ............ 438/643 |
| 6,054,398 A * | 4/2000 | Pramanick ................ 438/784 |
| 6,136,725 A | 10/2000 | Loan et al. |
| 6,203,613 B1 * | 3/2001 | Gates et al. ............... 117/104 |
| 6,337,148 B1 * | 1/2002 | Xu et al. .................... 428/675 |
| 6,498,091 B1 * | 12/2002 | Chen et al. ................. 438/627 |
| 7,074,719 B2 | 7/2006 | Kim et al. |
| 7,129,161 B2 | 10/2006 | Donohue |
| 7,300,869 B2 | 11/2007 | Sun et al. |
| 7,335,587 B2 | 2/2008 | Johnston et al. |
| 2002/0132469 A1 * | 9/2002 | Lee et al. .................. 438/628 |
| 2003/0180451 A1 * | 9/2003 | Kodas et al. ............... 427/123 |

(Continued)

OTHER PUBLICATIONS

Evaluation of tetrakis(diethylamino) hafnium precusrsor in the formation of Hafnium Oxide films using atomic layer deposition (Deshpande et al, Mat. Res. Soc. Symp. Proc. vol. 765, 2003 Materials Research Society).*

(Continued)

*Primary Examiner*—Fernando L Toledo
*Assistant Examiner*—Ankush K Singal
(74) *Attorney, Agent, or Firm*—Blakely, Sokoloff, Taylor & Zafman LLP

(57) ABSTRACT

A method including introducing a fluorine-free organometallic precursor in the presence of a substrate; and forming a conductive layer including a moiety of the organometallic precursor on the substrate according to an atomic layer or chemical vapor deposition process. A method including forming an opening through a dielectric layer to a contact point; introducing a fluorine-free copper film precursor and a co-reactant; and forming a copper-containing seed layer in the opening. A system including a computer including a microprocessor electrically coupled to a printed circuit board, the microprocessor including conductive interconnect structures formed from fluorine-free organometallic precursor.

5 Claims, 3 Drawing Sheets

U.S. PATENT DOCUMENTS

| | | | |
|---|---|---|---|
| 2004/0234704 A1* | 11/2004 | Garg et al. | 427/569 |
| 2005/0009325 A1 | 1/2005 | Chung et al. | |
| 2005/0208754 A1* | 9/2005 | Kostamo et al. | 438/622 |
| 2006/0141155 A1* | 6/2006 | Gordon et al. | 427/255.19 |
| 2006/0223300 A1* | 10/2006 | Simka et al. | 438/618 |
| 2006/0240187 A1* | 10/2006 | Weidman | 427/248.1 |
| 2007/0155158 A1* | 7/2007 | Gstrein et al. | 438/618 |
| 2007/0264816 A1* | 11/2007 | Lavoie et al. | 438/618 |
| 2008/0044687 A1* | 2/2008 | Bradley et al. | 428/704 |
| 2008/0064205 A1* | 3/2008 | Dominguez et al. | 438/653 |
| 2008/0146042 A1 | 6/2008 | Kostamo et al. | |
| 2008/0223287 A1* | 9/2008 | Lavoie et al. | 117/94 |
| 2008/0318418 A1* | 12/2008 | Norman | 438/652 |
| 2009/0053893 A1* | 2/2009 | Khandelwal et al. | 438/680 |
| 2009/0246931 A1 | 10/2009 | Huotari et al. | |

OTHER PUBLICATIONS

Li et al.(Atomic layer deposition of ultra thin copper metal thin films from a liquid Copper(I) Amidinate precursor, Journal of electrochemical society ,153(11) C787-C794(2006) , electronically available Sep. 13, 2006).*

Ho, et al., "Tantalum nitride barrier layer in copper-based ICs", Tantalum(III) nitride—Wikipedia, the free encyclopedia, http://en.wikipedia.org/wiki/Tantalum(III)_nitride, (Sep. 2, 2006), 4 pages.

IC Knowledge, "Atomic layer deposition (ALD)", ICKnowledge.com, (2003).

Lapedus, "ALD takes one step forward, one step back", EE Times Online, http://www.eetimes.com/showArticle.jhtml?articleID=191901291, (Aug. 10, 2006), 3 pages.

The Organometallic Hypertextbook, "Cyclopentadienyl Ligands", http://www.ilpi.com/organomet/cp.html, (Nov. 20, 2006), 7 pages.

Wikipedia, "Ruthenium", http://en.wikipedia.org/wiki/Ruthenium, (Nov. 20, 2006), 4 pages.

Zschech, et al., "Barrier/seed step coverage analysis in via structures for in-laid copper process control", MRI Montgomery Research, Future Fab International, vol. 14; http://www.future-fab.com/documents.asp?grID=216&d_ID=1673, (Feb. 11, 2003), 13 pages.

Intel Corporation, Non final office action dated Jul. 30, 2009 for U.S. Appl. No. 11/675,066.

Intel Corporation, Non final office action dated Jan. 21, 2010 for U.S. Appl. No. 11/675,066.

* cited by examiner

FLUORINE-FREE PRECURSORS AND METHODS FOR THE DEPOSITION OF CONFORMAL CONDUCTIVE FILMS FOR NANOINTERCONNECT SEED AND FILL

BACKGROUND

1. Field

Integrated circuit processing.

2. Description of Related Art

Modern integrated circuits use conductive interconnections to connect the individual devices on a chip or to send and/or receive signals external to the device(s). Common types of interconnections include copper and copper alloy interconnections (lines) coupled to individual devices, including other interconnections (lines) by interconnections through vias.

A typical method of forming an interconnection, particularly a copper interconnection, is a damascene process. A typical damascene process involves forming a via and an overlying trench in a dielectric to an underlying circuit device, such as a transistor or an interconnection. The via and trench are then lined with a barrier layer of a refractory material, such as titanium nitride (TiN), tungsten nitride (WN), tantalum (Ta), or tantalum nitride (TaN). The barrier layer serves, in one aspect, to inhibit the diffusion of the interconnection material that will subsequently be introduced in the via and trench into the dielectric. Next, an adhesion layer may be formed on the barrier layer to improve the adhesion of a subsequently formed conductive interconnection to the barrier layer or the via and/or trench. Suitable materials for an adhesion layer include titanium (Ti), tantalum (Ta) and ruthenium (Ru). Next, a suitable seed material is deposited on the walls of the via and trench. Suitable seed materials for the deposition of copper interconnection material include copper (Cu), nickel (Ni), cobalt (Co), and ruthenium (Ru). Next, interconnection material, such as copper, is introduced by electroplating in a sufficient amount to fill the via and trench and complete the interconnect structure. Once introduced, the interconnection structure may be planarized and a dielectric material (including an interlayer dielectric material) introduced over the interconnection structure to suitably isolate the structure.

As via and trench widths become smaller, the conductivity and fill ability of an interconnection may be changed. For example, physical vapor deposition (PVD) of a barrier layer or seed layer into a narrow via or trench is typically not conformal (i.e. non-uniform thickness of the via or trench). In addition, an overhang of the PVD-deposited material at an opening of the via or trench may pinch-off the via or trench and inhibit the ability to fill the via or trench with conductive material.

With respect to a seed layer, attempts to deposit a seed layer by chemical vapor deposition (CVD) often involve the use of an organometallic precursor (e.g., a copper ion complexed or otherwise bound to an organic moiety). The copper center of the organometallic precursor is then reduced with a reducing agent to form the seed layer. The organic moieties of the organometallic precursors for deposition of copper thin film, typically include fluorine. Even trace amounts of fluorine trapped or otherwise present in a copper seed layer may migrate toward the interconnect material or barrier layer and cause electromigration issues due to the formation of less adhesive interfaces and/or conductor contamination.

DETAILED DESCRIPTION

Figure 1:
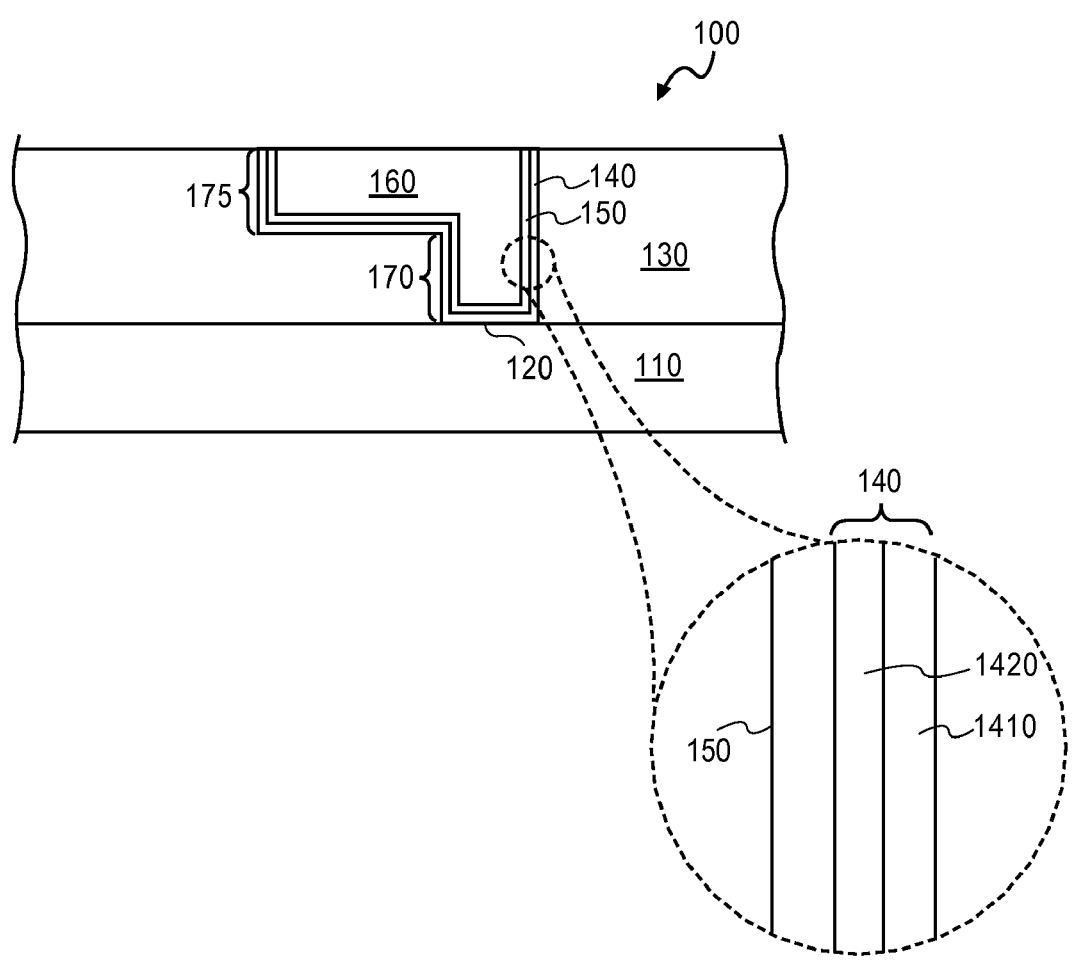
FIG. 1 shows a schematic, cross-sectional side view of an interconnect structure.

FIG. 1 shows a typical integrated circuit structure, such as a portion of a microprocessor chip on a silicon wafer. A typical integrated circuit such as a microprocessor chip may have, for example, multiple interconnection layers or levels separated from one another by interlayer dielectric material. Structure 100 includes an interconnection line over substrate 110. Substrate 110 may be the wafer substrate having circuit devices, including transistors, thereon as well as one or more levels of interconnection to devices. FIG. 1 shows contact point 120 that may be a circuit device formed on or in a wafer or an interconnection line formed above the wafer to devices on the wafer. It is to be appreciated that the techniques described herein may be used for various interconnections within an integrated circuit including to circuit devices and other interconnections. In this sense, contact point 120 represents such devices or interconnections where an interconnection contact is made.

FIG. 1 illustrates a cross-sectional side view of a portion of a substrate. Overlying substrate 110 is dielectric material 130. Dielectric material 130 is, for example, silicon dioxide ($SiO_2$) formed by a tetraethyl orthosilicate (TEOS) or a plasma enhanced chemical vapor deposition (PECVD) source. Dielectric material 130 may also be a material having, for example, a dielectric constant (k) less than the dielectric constant of $SiO_2$ (e.g., a "low k" material), including polymers and inorganic materials as known in the art.

FIG. 1 shows via 170 through dielectric material 130 to expose contact point 120. FIG. 1 also shows trench 175 formed in a portion of dielectric material 130 over via 170. A trench and via may be formed according to known techniques by, for example, initially using a mask, such as a photoresist mask, to define an area (e.g., a cross-sectional area) for a via opening and etching the via with a suitable chemistry, such as, for example, a $CH_3F/CF_4$ or $C_4F_8$ etch chemistry for $SiO_2$. The mask may then be removed (such as by an oxygen plasma to remove photoresist) and a second mask patterned to define, for example, a greater area (e.g., a greater cross-sectional area) for a trench opening. A subsequent mask and etch is introduced to form a trench and the second mask is removed leaving the substrate shown in FIG. 1.

FIG. 1 also shows the substrate having first material 140 deposited along all the sidewalls of the via and trench opening. In one embodiment, first material 140 is deposited to a thickness of approximately 1 to 25 nanometers (nm) depending on the desired characteristics of the material. A specific deposition process employing atomic layer deposition processing is described in detail below. First material 140 may be a single layer or a composite material of a number of layers including, in one embodiment, barrier layer 1410 (see inset) to be effective to inhibit interconnect material diffusion, such as copper diffusion into dielectric material 130. Barrier layer 1410 may also be chosen for its adhering properties to dielectric material 130. Suitable materials for barrier layer 1410 include tantalum nitride (TaN), tantalum silicon nitride (Ta- SiN), tungsten nitride (WN), tungsten silicon nitride (WSiN), titanium nitride (TiN), and titanium silicon nitride (TiSiN).

Separated from dielectric material 130 by barrier layer 1410 may be seed adhesion layer 1420 as part of a composite of layers that make up first material 140 (see FIG. 1, inset). Adhesion layer 1420 may be chosen for its property to adhere to barrier layer 1410 and/or its property to promote the adhesion of an interconnection material subsequently introduced in via 170 and/or trench 175. Representatively, transition metals such as tantalum and titanium are suitable materials for adhesion layer 1420, particularly where an underlying barrier layer (e.g., barrier layer 1410) includes similar elements. Ruthenium (Ru) and cobalt (Co) are other optional materials used for adhesion layers.

Referring to FIG. 1, overlying first material 140 as a blanket including along the side walls and bottom of via 170 and trench 175 is second material 150. Second material 150 is used, in one sense, in connection with a subsequent electroplating process to form an interconnection in via 170 and trench 175. While first material 140 may be a conductive material such as a tantalum compound that may be capable of carrying a current utilized in an electroplating process, first material 140 may also not be a good conductor and may cause non-uniform current flow which, in turn, may adversely affect the electroplating process and the reliability of the interconnection. Second material 150, on the other hand, generally is a better conductor than first material 140 and tends to provide a more uniform current flow during electroplating and, in one sense, serves as a seed material for electroplating the interconnection. Moreover, second material 150 may be selected to provide enhanced adhesion of the subsequently formed interconnection to the substrate. Second material 150 in the form of a film or layer as shown in FIG. 1 is often referred to as a seed layer.

In one embodiment, second material 150 is, for example, a copper material introduced using chemical or physical deposition techniques. A thickness of second material 150 along the side walls and bottom of via 170 and trench 175 of less than 300 angstroms (Å) is suitable.

FIG. 1 shows structure 100 after filling via 170 and trench 175 with interconnection material 160 of, for example, a copper material. The typical introduction technique for a copper interconnection material as noted above is an electroplating process. By way of example, a typical electroplating process involves introducing a substrate (e.g., a wafer) into an aqueous solution containing metal ions, such as copper sulfate-based solution, and reducing the ions (reducing the oxidation number) to a metallic state by applying current between substrate with second material 150 and an anode of an electroplating cell in the presence of the solution. Copper metal is deposited on to second material 150 to fill via 170 and trench 175 and form copper interconnection material 160.

In one embodiment, interconnection material 160 and or second material 150 is copper or a copper alloy. Suitable copper alloys include copper-tin (CuSn), copper-aluminum (CuAl), copper-indium (CuIn), copper-cadmium (CuCd), copper-zinc (CuZn), copper-bismuth (CuBi), copper-ruthenium (CuRu), copper-rhodium (CuRh), copper-rhenium (CuRe), copper-tungsten (CuW), copper-cobalt (CuCo), copper-palladium (CuPd), copper-gold (CuAu), copper-platinum (CuPt), and copper-silver (CuAg). Alloys can be formed by deposition using alloyed PVD targets, chemical vapor deposition (CVD) and, in some cases, electroplating (e.g., Cu—Sn alloys). Alternatively, copper may be doped with catalytic metals such as silver, platinum, tin, rhodium, and ruthenium by introducing a contact displacement layer on top of planarized copper interconnection material (see next paragraph) and applying a thermal anneal to form an alloy.

Structure 100 may be planarized such as by a chemical-mechanical polish as known in the art to dielectric material 130 to remove first material 140, second material 150, and any interconnection material 160 present on the upper surface of dielectric material 130. FIG. 1 shows structure 100 having interconnect material 160, second material 150 and first material 140 introduced into via 170 and trench 175 with the surface of dielectric material 130 and the interconnect structure planarized.

Referring again to second material 150, in one embodiment, to form a seed layer, a fluorine-free organometallic precursor may be introduced from families, such as, but not limited to, carboxylates, hydrides, thiolates, acetylides, and azides. Additional organometallic precursors include carbon/nitrogen ligand-based compounds, cyclopentadienides and β-diketonates. The organometallic precursor may have one or more metal moieties or centers. In general, the noted precursors contain symmetric or asymmetric ligands (e.g., molecules with an affinity to bind (e.g., covalently bind) to one or more copper ions).

Examples of fluorine-free organometallic precursors of carboxylates are copper (II) with Lewis base ligands such as imidozoles, phosphino alkanes, isonitriles, and N-hetero cyclic carbenes.

Examples of fluorine-free organometallic precursors of hydrides with Lewis base ligands include copper hydride with pyridine, copper borohydride with phosphine.

Examples of fluorine-free organometallic precursors of dithiocarbamates also include copper.

Examples of fluorine-free organometallic precursors of acetylides include acetylene functionalized with a ligand such as a $C_2$-$C_6$ alkyl (e.g., tert-butyl, isopropyl, sec-butyl, neopentyl, cyclobutyl, cyclopropyl), alicyclic structures (e.g., cyclohexyl) and aromatic structures (e.g., phenyl).

Examples of fluorine-free organometallic precursors of azides include precursors having Lewis base ligands such as phosphine, isocyanide, carbon monoxide (CO), amine, nitrile, or $C_4$-$C_6$ alkynes.

Examples of fluorine-free organometallic precursors of cyclopentadienides include precursors having ligands such as trimethyl phosphine, amine or methylamine.

Examples of fluorine-free organometallic precursors include β-diketonates and β-diketoiminates with $C_2$-$C_6$ alkyl ligands such as n-butyls. An exemplary precursor of β-diketoiminates is (4-ethylimino-1,1,1,5,5,5-hexahydrogen-2-pentanonato) copper, $Cu(acac-NEt)_2$.

As described, each of the noted organometallic precursors includes a copper ion or ions and one or more ligands. Multiple ligand precursors may use the same or different ligands.

In one embodiment, suitable fluorine-free precursors have a minimal residue remaining after vaporization or non-volatile residue (NVR) of 60 percent or less, in one embodiment, less than 20 percent.

Table 1 shows several examples of fluorine-free organometallic precursors and their TGA and NVR.

TABLE 1

| Compound Family | Compound Name | Thermogravimetric Analysis (T50) | Residue (NVR %) |
|---|---|---|---|
| Carboxylates | Copper$^{(II)}$ formate & Imidozle[1] | 193 | 14 |
| Acetylides | $(Cu^{(I)}C\equiv CPh)\infty$ | 355 | 80 |
|  | $(Cu^{(I)}C\equiv CBu^t)\infty$ | 174 | 42 |

TABLE 1-continued

| Compound Family | Compound Name | Thermogravimetric Analysis (T50) | Residue (NVR %) |
|---|---|---|---|
| Semi-labile C,N ligand | Cu(I)(Me2NCH2C6H4)2 | 224 | 18 |
| | Copper(II) phathlocynine[3] | 570 | 92 |
| Cp based | Cu(I)(EtCp)PPh3 | 253 | 20 |
| β-diketonate derivatives | Cu(I)(hfac)(DMCOD) | 146 | 4 |
| | Cu(II)(Acac-NEt)2[4] | 216 | 5 |
| Azides | Cu(I) (Hdpt)[5] | 250 | 15 |
| Hydride | Cu3H3Py3[7] | | 80 |
| | (PPh3)2Cu(I)BH4[6] | 267 | 9 |

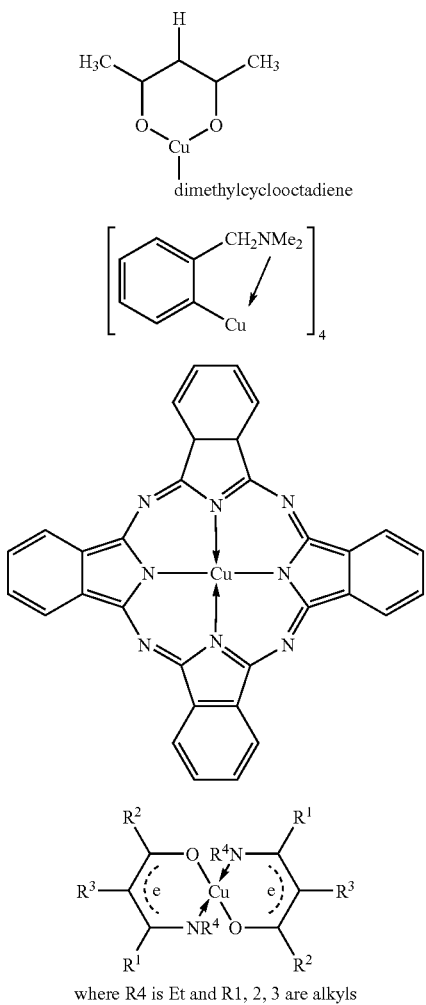

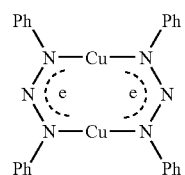

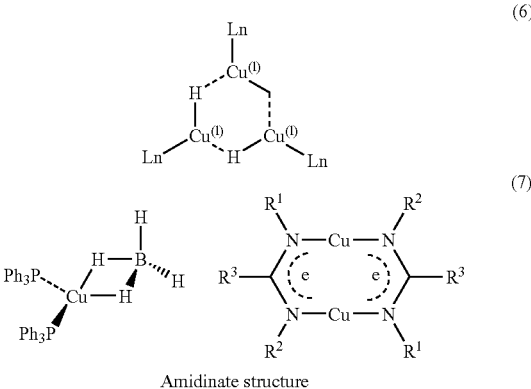

Amidinate structure

In addition to the above embodiments, other suitable fluorine-free organometallic precursors also include copper amidinate modification and stabilization by the use (of) basic ligands such as borates (BR3) or phosphine (PEt3) and backbone bridges of the N—P—N and N—N—N. Other suitable precursors include chelated amidinate or monomers such as Cu(amidinate)-trans(silyl-ligand) precursor for ALD/CVD deposition. Additional suitable amidinate precursors are dimers by the use of additional Lewis base ligands (e.g., isoprene). Fluorine-free copper complexes may also be suitable provided such complexes have reasonable molecular weights and vapor pressures making such complexes suitable for transport.

Suitable fluorine-free organometallic precursors may be solid or liquid. Solid or liquid precursors are vaporized during ALD or CVD. Solid or liquid precursors may use a solvent or transport media (e.g., toluene for amidinate-based Cu precursors) for storage and metering and later flash vaporized. Alternatively, solid or liquid precursors may be dissolved with equilibrium pressure in the carrier gas.

In one embodiment, a deposition process (ALD or CVD) employing a fluorine-free organometallic precursor may also employ a co-reactant(s) such as, but not limited to, hydrogen ($H_2$), ammonia ($NH_3$), hydrazine ($H_4N_2$) borane adducts (e.g., $B_2H_6$, THF-$BH_3$, a Lewis base pair of $BR_3$ and $NR_3$ with R equal to a one electron donor), primary, secondary, and tertiary amines ($NR_3$, where R is any alkyl, halide or H substituent), silanes ($SiH_4$, $HSiR_3$, $H_2SiR_2$, and $H_3SiR$, where R is any alkyl or halide) and methane ($CH_4$). In addition, during deposition of a precursor or co-reactant, an iridium (Ir) filament present in a deposition chamber (e.g., attached at an entry point) can be used to activate and decompose the precursors or co-reactants described above.

In a representative embodiment of an ALD process, an ALD film formation cycle may consist of two pulses, one for the organometallic precursor and a second pulse for the co-reactant, with a purge of the reaction chamber between pulses. Representatively, in the first pulse, the organometallic precursor adsorbs on the substrate and is self limiting in that there is a limited number of sites on the substrate for the precursor to adsorb. After purge, the co-reactant is pulsed and reacts with the adsorbed precursor molecules to remove and/or replace ligands. In one embodiment, a plasma source of an activated gas is introduced during the precursor pulse, the co-reactant pulse, or both. The conditions by which each of the precursor, co-reactant and optional plasma source are introduced to form an atomic layer is an example of a set of conditions. The self-limiting nature of the precursor and co-reactant provides improved conformality of a formed film compared to physical vapor deposition techniques, thus eliminating overhang.

In one embodiment, a substrate is pretreated in an inert atmosphere to enhance copper nucleation and growth. The pre-treatment can consist, for example, of a plasma pulse before deposition, or high deposition rate layer of copper. In addition, a protective copper layer is deposited via rapid-CVD to prevent tantalum (Ta) oxidation or nitridation with nitrogen- or oxygen-containing co-reactants (e.g., rapid-CVD of a copper (Cu) precursor in helium (He) or hydrogen ($H_2$) at moderately high temperatures above 200° C.).

As noted above, in one embodiment CVD and ALD (as well as combinations and plasma-enhanced versions) are used to deposit a seed layer such as second layer 150 described above with respect to FIG. 1.

In an embodiment of an ALD process, accessory agents may be introduced to improve the deposition process. For example, alcohols or ethers may be used to regenerate a reactive surface (e.g., expose pure copper surface to a precursor pulse). In addition, silanes (e.g., $SiH_4$) can be used to regenerate or clean the surface. Representatively, a suitable pulsing sequence or mode may be $SiH_4$/precursor/$NH_3$. Still further, an $NH_3$ pulse can also be used for limiting copper surface diffusion during ALD or CVD at moderate temperatures (e.g., 80° C. to 150° C.). In one embodiment, to avoid nitrogen contamination, the mole fraction of $NH_3$ may be reduced in a reactor (using inert or reactive gas).

In one embodiment, following the deposition of a layer or film such as second layer 150 derived from a fluorine-free organometallic precursor, the layer is cleaned and/or purified. Suitable post-deposition techniques include the use of reducing wet chemical agents such as oxalic acid ($C_2H_2O_4$). Another technique is introducing an electrochemical potential to, for example, convert Cu(N) CVD films to Cu films.

For ex-situ anneals, a supercritical solvent such as supercritical carbon dioxide ($SCCO_2$) may be used to clean or convert CVD CuN films to Cu films. To enhance reduction of copper films in a reducing gaseous atmosphere (e.g., $SiH_4$, diethylsilane, $B_2H_6$, $H_2$), ruthenium (Ru) particles or noble metal promoters can be deposited on a CVD copper film.

Figure 2:
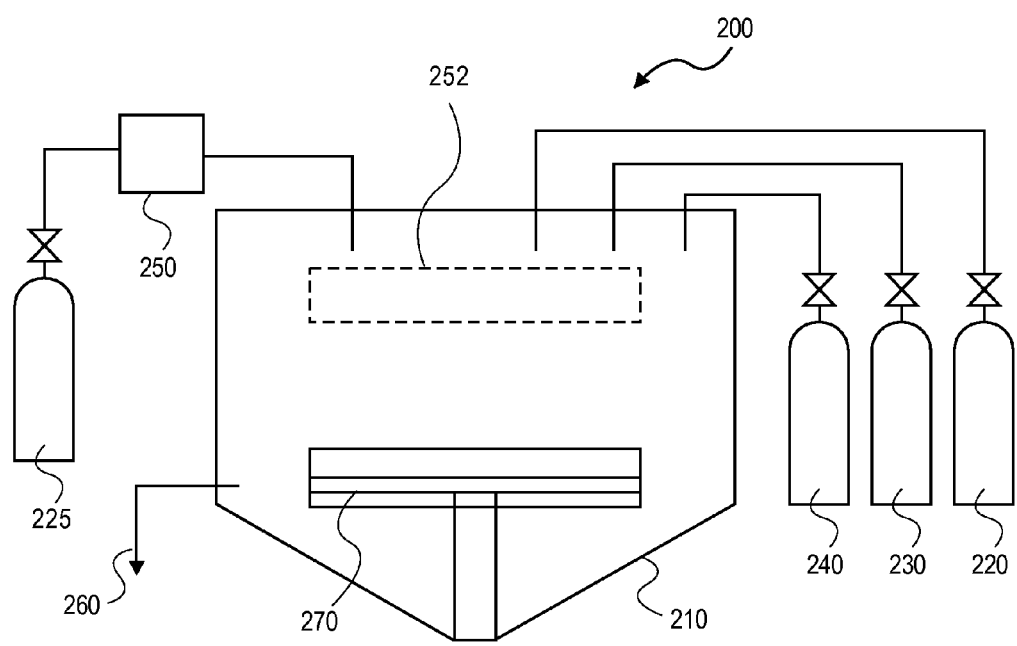
FIG. 2 shows a schematic side view of a chamber suitable for atomic layer deposition processing.

FIG. 2 shows a schematic of a representative system for forming an ALD layer such as a seed layer (e.g., second layer 150 in FIG. 1) on a substrate. System 200 includes chamber 210 having an interior volume suitable to accommodate a substrate, such as a semiconductor wafer. Connected to an interior volume of chamber 210 are a number of process gas sources, including gas source 220 that delivers, for example, an organometallic precursor; gas source 230 that delivers, for example, a co-reactant; and gas source 240 of a purge or other gas source. Also connected to chamber 210 is plasma activator 250 and/or plasma activator 252. Remote plasma activator 250 is separate from and communicates with chamber 210 while plasma activator 252 may be operated directly in chamber 210 (e.g., a capacitively coupled plasma electrode). In one example, a plasma activator such as remote plasma activator 250 and/or plasma activator 252 includes a plasma or ionization source for activating gas source 225, such as a hydrogen or other gas source(s) for introduction of the activated species into chamber 210 (plasma source to include ions, electrons, protons and radicals of the activated gas). The plasma source may be described in terms of energy density related to factors such as an energy applied to the gas source at the plasma activator (e.g., to establish a concentration of activated species in the plasma source) and the distance of plasma activator from a substrate surface in chamber 210. Energy density is one variable associated with a plasma source. Other variables include the duration or exposure time of the substrate (or reactants) to the plasma source and when a plasma source is introduced. In one embodiment, the plasma source may be introduced during more than one of the pulses of an ALD process (e.g., during the purge pulse, co-reactant pulse or both).

System 200 also includes an example of a temperature source (shown as temperature source 270) that may be used to heat an interior of chamber 210 to a desired temperature for a reaction between the substrate and the precursor or precursor and co-reactant. FIG. 2 shows temperature source 270 disposed within chamber 210 (in this case, within a stage within the chamber). It is appreciated that a suitable reactor may include hotwall or coldwall chambers. FIG. 2 also shows evacuation source 260 connected to an interior chamber 210 to evacuate reactive species or process gases from the chamber. Evacuation source 260 may be connected to a vacuum pump or other source.

Figure 3:
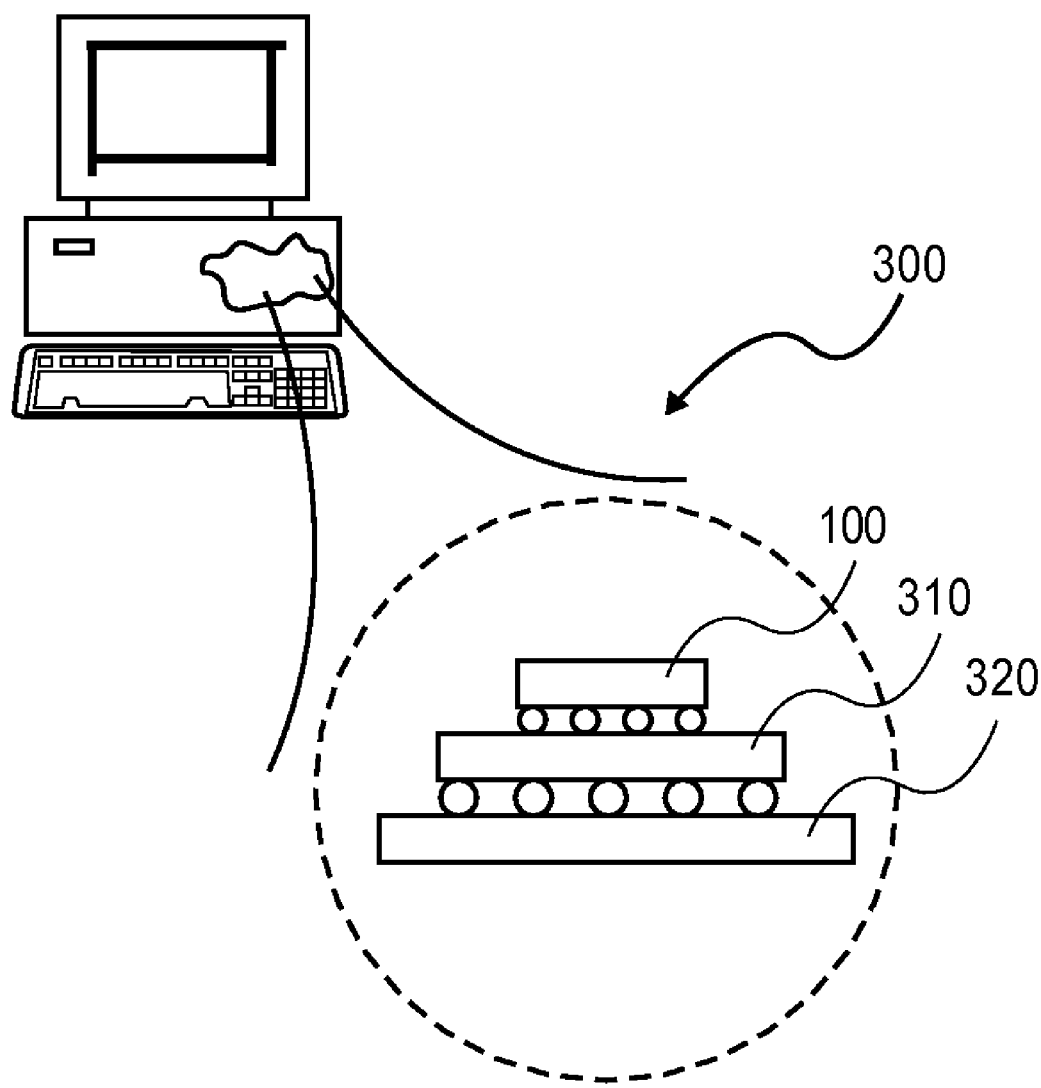
FIG. 3 shows a computer system including a microprocessor having interconnect lines formed according to techniques described with reference to FIGS. 1-2.

FIG. 3 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tape and compact disc player, video cassette recorder, MP3 (motion picture experts group, audio layer 3 player, etc.), and the like. FIG. 3 illustrates the package is part of a desktop computer. FIG. 3 shows electronic assembly 300 including die 100 (see FIG. 1 and the accompanying text) physically and electrically connected to package substrate 310. Die 100 is an integrated circuit die, such as a microprocessor die having, for example, transistor structures interconnected or connected to power/ground or input/output signals external to the die through interconnect lines formed as described with reference to FIG. 1. Electrical contact points (e.g., contact pads on a surface of die 100) are connected to package substrate 310 through, for example, a conductive bump layer. Package substrate 310 may be used to connect die 100 to printed circuit board 320, such as a motherboard or other circuit board.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
    forming an opening through a dielectric layer to a contact point;
    introducing a fluorine-free copper film precursor and a co-reactant, wherein introducing the precursor and the co-reactant is performed through an atomic layer deposition process, wherein the precursor comprises a non-volatile residue of 60 percent or less, wherein the precursor is selected from the group consisting of a hydride, a thiolate, an acetylide, an azide, a cyclopentadienide and a β-diketonate; and
    forming a copper-containing seed layer in the opening.

2. The method of claim 1, wherein the dielectric layer comprises an oxygen-terminated surface and prior to introducing the precursor, the method comprises treating the substrate to enhance nucleation of copper.

3. The method of claim 2, wherein treating the substrate comprises treating with a silicon moiety.

4. The method of claim 2, wherein treating the substrate comprises treating with a hydrogen source.

5. The method of claim 3, wherein following forming a copper-containing film, the method comprises exposing the film to a reducing agent.

* * * * *